United States Patent
Rickman et al.

[11] Patent Number: 6,108,472
[45] Date of Patent: Aug. 22, 2000

[54] DEVICE FOR RE-DIRECTING LIGHT FROM OPTICAL WAVEGUIDE

[75] Inventors: Andrew George Rickman, Marlborough; Arnold Peter Roscoe Harpin; Robin Jeremy Richard Morris, both of Oxford; Stephen Gorton, Abingdon; Mehdi Asghari, Swindon, all of United Kingdom

[73] Assignee: Bookham Technology Plc., United Kingdom

[21] Appl. No.: 09/019,729

[22] Filed: Feb. 6, 1998

[30] Foreign Application Priority Data

Feb. 7, 1997 [GB] United Kingdom ............. 9702559

[51] Int. Cl.$^7$ ................. G02B 6/26; G02B 6/42
[52] U.S. Cl. ................... 385/48; 385/49
[58] Field of Search ................... 385/48, 49

[56] References Cited

U.S. PATENT DOCUMENTS

| | | | |
|---|---|---|---|
| 4,549,782 | 10/1985 | Miller | 385/48 |
| 4,792,202 | 12/1988 | Zucker et al. | 385/48 |
| 5,029,962 | 7/1991 | Uken et al. | 385/48 |
| 5,071,213 | 12/1991 | Chan | 385/52 |
| 5,263,111 | 11/1993 | Nurse et al. | 385/130 |
| 5,282,080 | 1/1994 | Scifres et al. | 359/344 |
| 5,311,604 | 5/1994 | Rogner et al. | 385/14 |
| 5,390,271 | 2/1995 | Priest | 385/48 |
| 5,402,511 | 3/1995 | Malone et al. | 385/48 |
| 5,479,540 | 12/1995 | Boudreau et al. | 385/14 |
| 5,485,021 | 1/1996 | Abe | 257/14 |
| 5,489,988 | 2/1996 | Ackley et al. | 356/436 |
| 5,499,309 | 3/1996 | Kozuka et al. | 385/48 |
| 5,832,156 | 11/1998 | Strasser et al. | 385/48 |

FOREIGN PATENT DOCUMENTS 0331338  9/1989  European Pat. Off. .......... G02B 6/42

OTHER PUBLICATIONS

Patent Abstracts of Japan, entitled "Optical Coupler", Publication No. 63191111, Publication Date: Aug. 8, 1988, Applicant: Nippon Telegr & Teleph Corp <NTT>, Inventor: Nishi Norio.

Schüppert, Bernd, et al., entitled "Integrated Optics in Si and SiGe–Heterostructures", Publication Date: Sep. 27, 1992, XP000559168, pp. 793–800.

Schmidtchen, J., et al., "Low Loss Singlemode Optical Waveguides with Large Cross–Section in Silicon–On–Insulator", Electronics Letters, vol. 27, No. 16, Aug. 1991, pp. 1486–1488.

*Primary Examiner*—Teresa M. Arroyo
*Assistant Examiner*—Robert E. Wise
*Attorney, Agent, or Firm*—Webb Ziesenheim Logsdon Orkin & Hanson, P.C.

[57] ABSTRACT

The device is formed on a silicon-on-insulator chip (which comprises a layer of silicon (1) separated from a substrate (3) by an insulator layer (2)) and comprises an integrated waveguide (4) formed in the silicon layer (1) and a reflective facet (6) formed in a recess in the silicon layer (1). The facet (6) is positioned to redirect light in a desired direction. The waveguide (4) and facet (6) are both formed in the silicon layer (1) so their positions can be defined by the same lithographic steps so they are automatically aligned with each other.

10 Claims, 2 Drawing Sheets

DEVICE FOR RE-DIRECTING LIGHT FROM OPTICAL WAVEGUIDE

TECHNICAL FIELD

This invention relates to a device for re-directing light from an optical waveguide on a silicon-on-insulator chip.

BACKGROUND ART

In integrated optical circuits, there is often a requirement to re-direct light from an optical waveguide, e.g. from a waveguide formed on the chip to a receiver such as a photodiode, mounted on the chip. A variety of ways of achieving this have been proposed in a variety of types of integrated optical circuits, e.g. by positioning a photodiode within a recess formed in the chip so it receives light emerging from a waveguide on the chip. Many of the known arrangements are however, difficult to fabricate accurately and inexpensively due to the requirement of ensuring accurate positioning and alignment of the various components concerned.

This invention aims to provide a device formed on a silicon-on-insulator chip and which employs features of such a chip and of waveguides formed thereon to assist in the alignment of the components of the device.

DISCLOSURE OF INVENTION

According to the present invention, there is provided a device for re-directing light from an optical waveguide on a silicon-on-insulator chip which comprises a layer of silicon separated from a substrate by an insulator layer, the device comprising an integrated waveguide formed in the silicon layer and a reflective facet formed in a recess in the silicon layer, the facet being positioned to receive light from the waveguide and angled so as to re-direct the light in a desired direction, the waveguide and facet both being formed in the silicon layer so their locations can be defined by the same lithographic step.

Preferred and optional features of the invention will be apparent from the following description and from the subsidiary claims of the specification.

BRIEF DESCRIPTION OF DRAWINGS

The invention will now be further described, merely by way of example, with reference to the accompanying drawings, in which.

BEST MODE OF CARRYING OUT THE INVENTION

As indicated above, this invention relates to devices formed on silicon-on-insulator wafers which are readily commercially available. The chip comprises a layer of silicon separated from a silicon substrate by a layer of silicon dioxide. The thickness of the upper layer of silicon is typically increased to the required size by epitaxial growth.

Integrated optical waveguides in the form of ribs may be formed in the upper silicon layer. Methods of manufacturing such waveguides are described in the paper "Low loss single mode optical waveguides with large cross-section in silicon-on-insulator" by J. Schmidtchen et al, Electronic Letters, 27, p1486, 1991.

Figure 2:
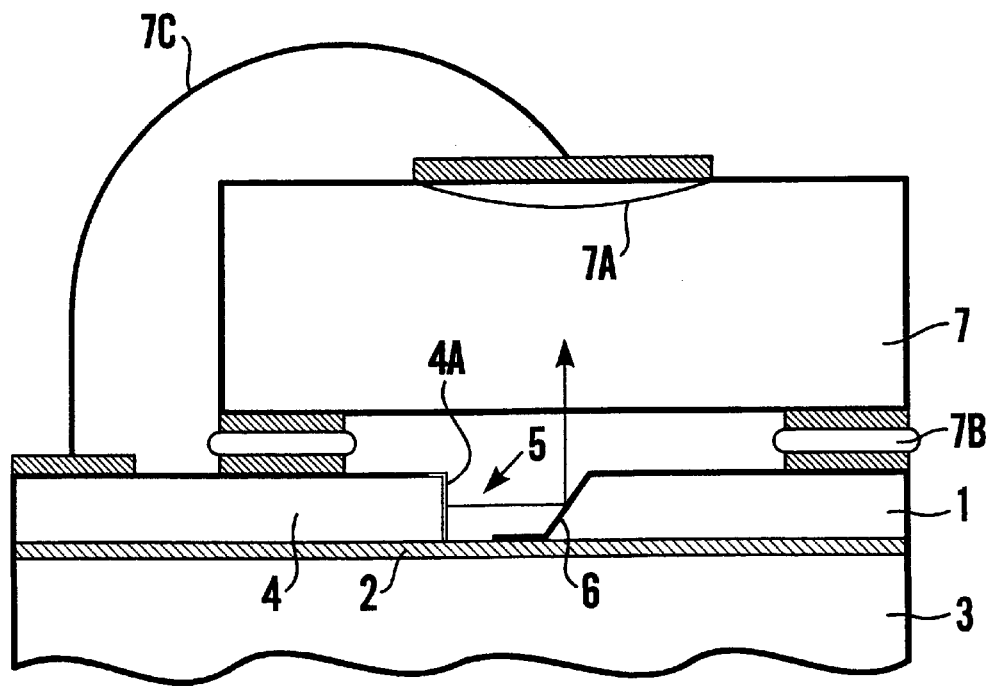
FIG. 2 is a schematic cross-sectional view through a silicon-on-insulator chip showing an embodiment of a device according to the invention for re-directing light from a waveguide on the chip to a photodiode.

FIG. 2 shows the silicon layer 1, the silicon dioxide layer 2 and the silicon substrate 3. A rib waveguide 4 is formed in the silicon layer 1 which is typically around 5 or 10 microns in thickness. The waveguide 4 terminates at a facet 4A in a recess 5 formed in the silicon layer 1. On the opposite side of the recess 5 a facet 6 is formed on a side surface of the silicon layer 1. The facet 6 is coated with aluminium (or other optically reflective coating) and is angled at 54.7 degrees to the axis of the waveguide 4. Light emerging from the waveguide facet 4A thus falls on the facet 6 and is reflected so as to be re-directed in a direction substantially perpendicular to the plane of the chip. With a facet angled at 54.7 degrees to the axis of the waveguide, the light is reflected in a direction lying 19.4 degrees to the vertical.

The facet 6 may be formed at an angle determined by a crystallographic plane of the silicon or may be formed at other angles, e.g. by dry etching.

In another embodiment (not shown), the position of the silicon layer 1 in which the facet 6 is formed may have a greater thickness than the portion of the silicon layer 1 in which the waveguide 4 is formed. The facet 6 may thus be of larger size so a larger proportion of light diverging from the end of the waveguide 4 is intercepted by the facet and reflected in the desired direction.

An InGaAs photodiode 7 is soldered (7B) on the chip over the recess 5 by standard eutectic die attach techniques so that its active region 7A is located in alignment with the light reflected by the angled facet 6.

Electrical connection is made to the photodiode 7 by means of a wire bond 7C which connected with conductor tracks or circuitry provided on the upper surface of the chip.

The arrangement described above has the benefit of being simple, yet easy to fabricate. Alignment of the facet 6 with the waveguide 4 is achieved automatically firstly because the facet is formed in the same silicon layer in which the waveguide is formed so is automatically aligned in the vertical direction and, secondly, the location of the recess 5 and facet can be defined by the same photolithographic step used to define the location of the waveguide, so they are automatically aligned in the lateral direction.

As will be appreciated from the above, the facet is monolithically formed from the same silicon-on-insulator chip as the silicon waveguides and, like the waveguides, is formed in the epitaxial layer 1 of silicon rather than in the silicon substrate 3. The recess 5 and facet 6 are micro-machined by means of appropriate masking and etching steps and may, for instance, be etched using caesium hydroxide which preferentially etches the silicon layer 1. The silicon dioxide layer 2 acts as a natural etch stop during this process.

By this means the facet 6 can be formed directly opposite the end of the waveguide 4 and the distance between the waveguide facet 4A and the reflective facet 6 can be kept to a minimum, e.g. to less than 15 microns, and preferably less than 10 microns. This helps reduce losses due to the divergence of the light emitted from the waveguide facet 4A to a minimum.

The active region 7A of the photodiode 7 typically has a diameter of around 125 microns so needs to be located on the silicon chip over the recess 5 with a positional tolerance of around ±50 microns.

It will be appreciated that a similar arrangement may be used to direct light from a waveguide to other forms of light receivers mounted on the chip or to direct light from a light source, e.g. a laser or light emitting diode, mounted on the chip into a waveguide formed thereon. A vertical cavity surface emitting laser (not shown) may, for instance, be mounted over the recess 5 so as to direct light onto the facet 6.

The facet 6 may be formed at other angles so as to direct light in a desired direction. Light would typically be directed out of the plane of the chip but may also be directed to a device or another waveguide on the chip.

In addition, it may be desirable to angle the facet 6 about an axis perpendicular to the plane of the chip to reduce problems due to back reflection, particularly from areas at the edge of the facet which can back-reflect into the waveguide 4 if the edges of the facet 6 lie perpendicular to the waveguide axis. A similar result can be achieved by forming the waveguide at an angle and/or providing an angled facet 4A on the end of the waveguide 4.

Figure 3A:
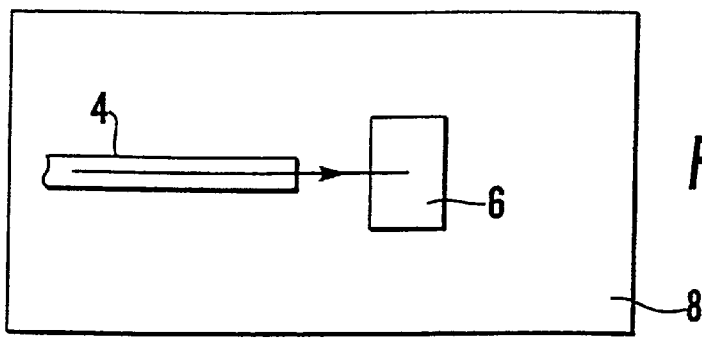
FIGS. 3A to 3D show schematic plan views of various embodiments of the device.
Figure 3B:
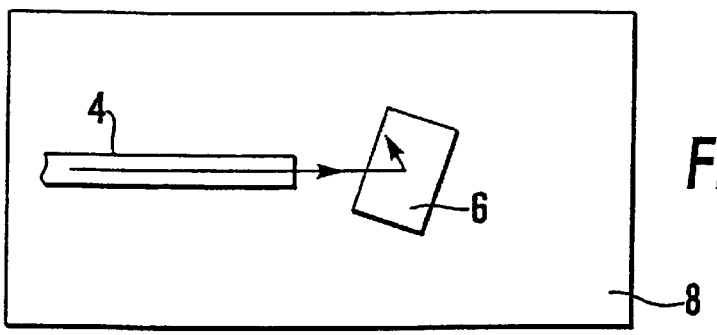
Figure 3C:
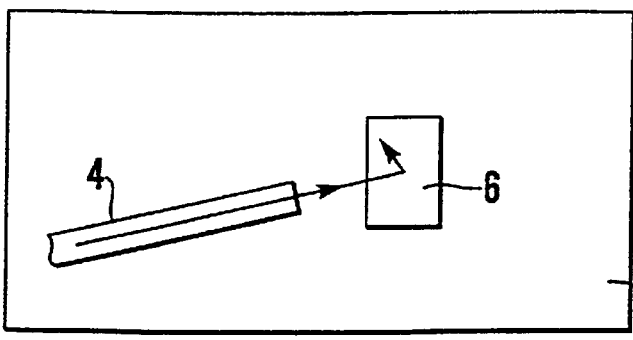
Figure 3D:
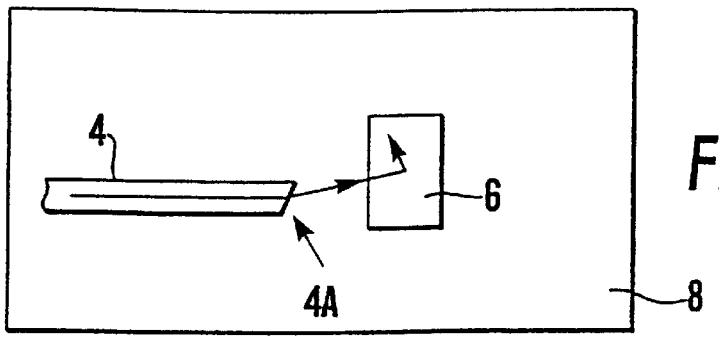

These possibilities are illustrated in FIGS. 3A to 3D which each show plan views of the chip. FIG. 3A shows a plan view of the arrangement illustrated in FIG. 2 which can give rise to back reflections if vertical surfaces exist on the facet 6. In FIG. 3A the light is shown being re-directed out of the plane of the chip in a direction normal to the chip. FIG. 3B shows an arrangement in which the facet 6 has been further tilted about an axis perpendicular to the chip compared to FIG. 3A. FIG. 3C shows an arrangement in which the waveguide 4 is formed at an angle across the chip compared to the arrangement of FIGS. 3A and FIG. 3D shows an arrangement in which the waveguide facet 4A of the waveguide 4 is angled so light emerging therefrom is refracted away from the axis of the waveguide. In each case, the arrangement causes the light to be re-directed out of the plane of the chip but at an angle to the normal thereof. This may require the position of the photodiode 7 over the recess 5 to be adjusted slightly to ensure it receives the re-directed light.

Figure 1:
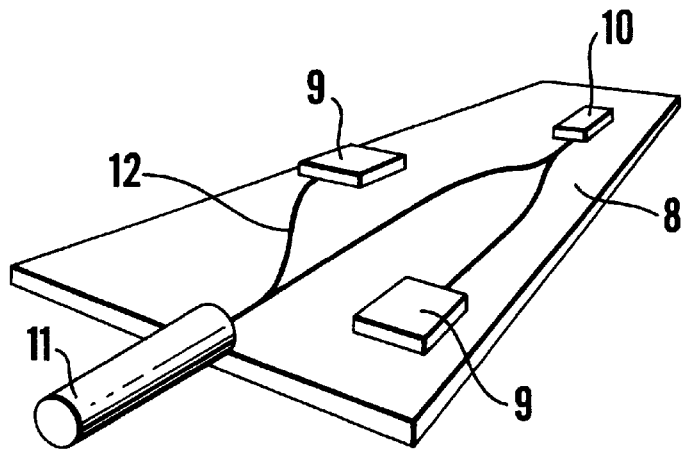
FIG. 1 shows a schematic, perspective view of an integrated optical circuit which includes at least one photodiode for receiving light transmitted along a waveguide formed on the device.

FIG. 1 shows a perspective view of an integrated optical circuit, in this case a transceiver, formed on a silicon-on-insulator chip 8. Two photodiodes 9 and a laser 10 are mounted on the chip 8. Light is transmitted to the chip 8 by an optical fiber 11 and rib waveguides 12 are provided on the chip 8 for transmitting light to the various components. FIG. 2 described above illustrates the manner in which light is directed from a rib waveguide 12 to one of the photodiodes 9.

What is claimed is:

1. A device for re-directing light from an optical waveguide on a silicon-on-insulator chip which comprises a layer of silicon separated from a substrate by an insulator layer, the device comprising an integrated waveguide formed in the silicon layer and a reflective facet formed in a recess in the silicon layer, the facet being positioned to receive light from the waveguide and angled so as to re-direct the light in a desired direction, the waveguide and facet both being formed in the silicon layer so their locations can be defined by the same lithographic step.

2. A device as claimed in claim 1 in which the facet is angled to direct light out of the plane of the chip.

3. A device as claimed in claim 2 in which the facet is angled to direct light in a direction substantially perpendicular to the plane of the chip.

4. A device as claimed in claim 2 in which the facet is angled to direct light out of the plane of the chip at an angle to the normal of the chip.

5. A device as claimed in claim 4 in which the facet is angled so its edges do not lie perpendicular to light received from the waveguide.

6. A device as claimed in claim 1 arranged to direct light received from the optical fiber to a photodiode mounted on the chip.

7. A device as claimed in claim 6 in which the photodiode is mounted over the recess in which the facet is formed.

8. A device as claimed in claim 1 in which a laser or light emitting diode is mounted over the recess in which the facet is formed.

9. A device as claimed in claim 1 in which the distance between the end of the waveguide and the facet is less than 15 microns, and preferably less than 10 microns.

10. An integrated optical circuit including a device for re-directing light from an optical waveguide on a silicon-on-insulator chip which comprises a layer of silicon separated from a substrate by an insulator layer, the device comprising an integrated waveguide formed in the silicon layer and a reflective facet formed in a recess in the silicon layer, the facet being positioned to receive light from the waveguide and angled so as to re-direct the light in a desired direction, the waveguide and facet both being formed in the silicon layer so their locations can be defined by the same lithographic step.

* * * * *